United States Patent
Khan et al.

(10) Patent No.: US 8,558,296 B2
(45) Date of Patent: *Oct. 15, 2013

(54) LOW LEAKAGE CAPACITOR FOR ANALOG FLOATING-GATE INTEGRATED CIRCUITS

(75) Inventors: Imran Mahmood Khan, Richardson, TX (US); Allan T. Mitchell, Heath, TX (US); Kaiping Liu, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 63 days.

This patent is subject to a terminal disclaimer.

(21) Appl. No.: 13/070,222

(22) Filed: Mar. 23, 2011

(65) Prior Publication Data
US 2012/0241829 A1 Sep. 27, 2012

(51) Int. Cl.
*H01L 27/108* (2006.01)
(52) U.S. Cl.
USPC ........... 257/296; 257/500; 257/532; 257/298; 257/E27.106
(58) Field of Classification Search
USPC ................... 257/296, E27.106, 500, 532, 298
See application file for complete search history.

(56) References Cited

U.S. PATENT DOCUMENTS

| 8,178,915 B1 * | 5/2012 | Mitchell et al. ............... 257/298 |
| 2004/0077141 A1 * | 4/2004 | Kim .............................. 438/240 |
| 2005/0085046 A1 * | 4/2005 | Kao et al. ....................... 438/396 |
| 2009/0115000 A1 * | 5/2009 | Hwang ........................... 257/408 |
| 2011/0169064 A1 * | 7/2011 | Chou et al. ..................... 257/298 |

OTHER PUBLICATIONS

Ahuja et al., "A Very High Precision 500-nA CMOS Floating-Gate Analog Voltage Reference", J. Solid-State Circ., vol. 40, No. 12 (IEEE, Dec. 2005), pp. 2364-2372.
Lande et al., "An Analog Floating-Gate Memory in a Standard Digital Technology", Proceedings of the Fifth International Conf. on Microelectronics for Neural Networks (IEEE, 1996), pp. 271-276.
U.S. Appl. No. 13/070,263, filed Mar. 23, 2011, entitled "Unitary Floating-Gate Electrode with Both N-Type and P-Type Gates", commonly assigned.

* cited by examiner

*Primary Examiner* — Eugene Lee
*Assistant Examiner* — Elias M Ullah
(74) *Attorney, Agent, or Firm* — Rose Alyssa Keagy; W. James Brady; Frederick J. Telecky, Jr.

(57) ABSTRACT

An analog floating-gate electrode in an integrated circuit, and method of fabricating the same, in which trapped charge can be stored for long durations. The analog floating-gate electrode is formed in a polycrystalline silicon gate level, and includes portions serving as a transistor gate electrode, a plate of a metal-to-poly storage capacitor, and a plate of poly-to-active tunneling capacitors. Silicide-block silicon dioxide blocks the formation of silicide cladding on the electrode, while other polysilicon structures in the integrated circuit are silicide-clad.

13 Claims, 6 Drawing Sheets

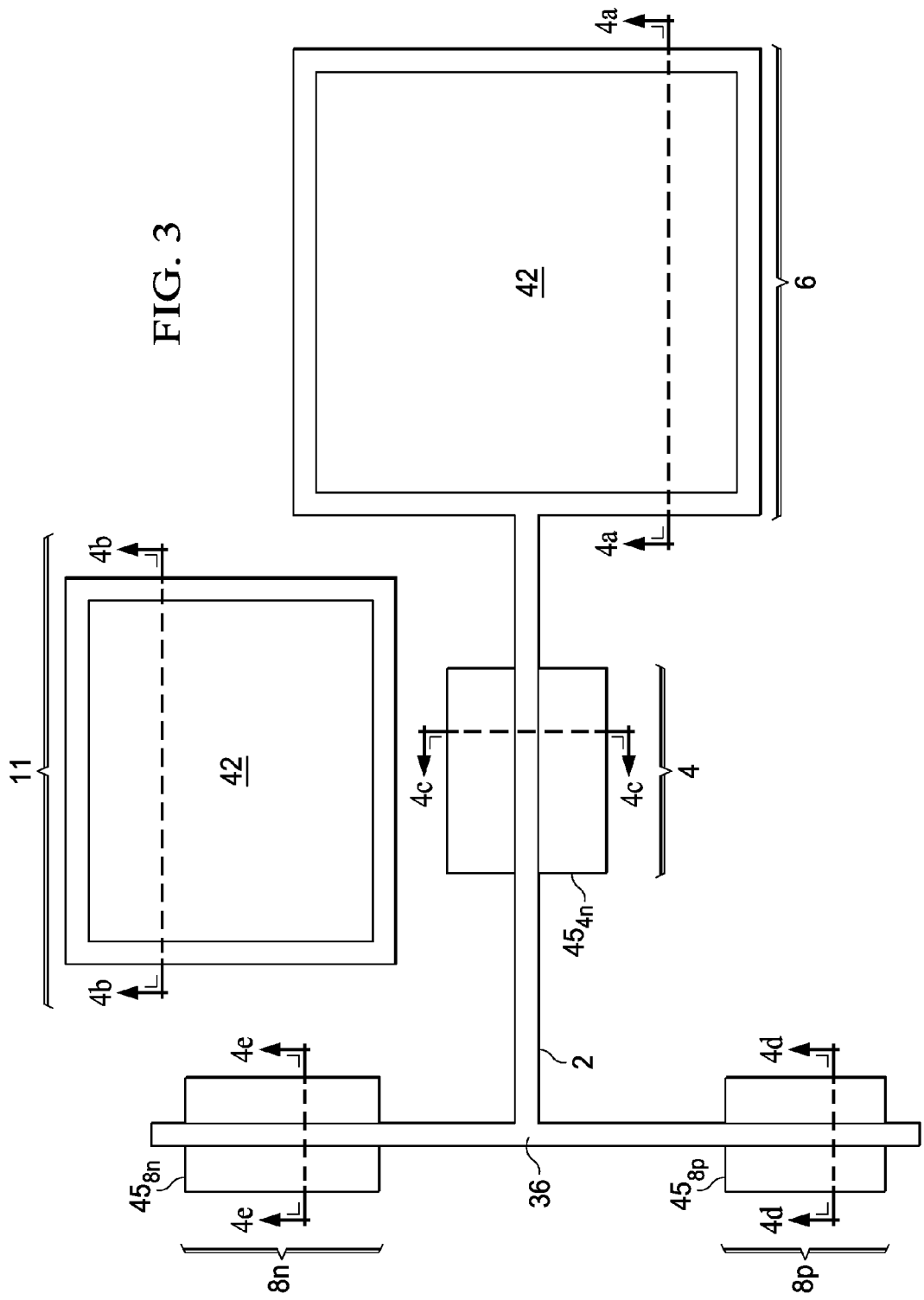

LOW LEAKAGE CAPACITOR FOR ANALOG FLOATING-GATE INTEGRATED CIRCUITS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

This invention is in the field of semiconductor integrated circuits. Embodiments of this invention are more specifically directed to capacitor structures that define analog voltages in such integrated circuits.

An important type of semiconductor integrated circuits are those circuits that implement analog circuit functions in which input and output signals and information are communicated and processed as such. Analog circuit functionality is important in such diverse fields as instrumentation and control systems, audio applications, power management of large-scale electronic systems, communications functions, motor control functions (e.g., such as in hard disk drives), and the like. Some integrated circuits, for example interface circuitry such as analog-to-digital converters (ADCs) and digital-to-analog converters (DACs), include both analog and digital functionality.

Typically, analog integrated circuit functions rely on reference levels (voltages and currents) that are established and regulated on-chip. These reference levels are often involved in such functions as signal measurement, signal conditioning, conversion and interface functions (ADCs and DACs), etc. Proper functioning of the analog integrated circuit, and particularly such functioning over variations in power supply voltage, temperature, and other operating conditions, often critically depends on the stability of reference voltages and currents over such variations. In addition, manufacturing variations as reflected in physical parameters of the integrated circuits, can affect the reference levels as generated in these integrated circuits.

Accordingly, many analog integrated circuits include some ability to "trim" or adjust the on-chip precision reference circuits, as well as other circuit functions within those integrated circuits. Trimming is typically performed at manufacture, after electrical measurement or other evaluation of the performance of the raw circuit as manufactured. Various technologies for such trimming and adjustment are known, including laser trimming of resistors, and programming of fuses or antifuses in a digital control word that selectively shunts resistors within a resistor bank. Recently, programmable non-volatile memory elements have been considered for use as trimming elements, for example in replacement of fuses or antifuses. Examples of these non-volatile memory elements include floating-gate metal-oxide-semiconductor (MOS) transistors, in which the state of the transistor is defined by charge trapped at a floating gate electrode. Programming of the device is accomplished through such mechanisms as Fowler-Nordheim tunneling, and hot carrier injection.

Certain analog applications, such as high-precision ADCs and DACs, require extremely precise and stable reference circuits. Not only must the reference levels have a high initial accuracy (e.g., on the order of 1 mV for a reference voltage on the order of 5 volts), but temperature stability of on the order of 5 ppm/° C. and long-term drift of on the order of 10 ppm/1000 hours are also now commonly required. To achieve such precision, it is useful to more directly trim circuit elements, such as circuit elements at the inputs and in the feedback loops of amplifiers in the reference circuits. In addition, such direct trimming of circuit elements can result in reduced power consumption than resistor-bank type of trimming circuits, which is of course well-suited for modern battery-powered applications.

It is attractive to use floating-gate techniques to trim capacitors directly at the reference circuit amplifier, because of the precision with which charge may be programmed according to modern programming methods, and also because the programming operation can be carried out by purely electrical means. But any trapped charge applied in such trimming must be retained at the floating gate for the life of the device, considering that the trimming may only be performed at the time of manufacture. Conventional capacitor dielectric films in analog integrated circuits have been observed, in connection with this invention, to exhibit some degree of leakage over time. An example of such a conventional capacitor dielectric is silicon nitride deposited by plasma-enhanced chemical vapor deposition (PECVD). As such, the use of floating-gate capacitor technology in conventional analog circuits would require additional costly processes such as deposition of dielectric films specifically for the programmable capacitors, deposition and patterning of an additional conductor layer, and the like.

Ahuja et al., "A Very High Precision 500-nA CMOS Floating-Gate Analog Voltage Reference", *J. Solid-State Circ.*, Vol. 40, No. 12 (IEEE, December 2005), pp. 2364-72 describes the use of floating-gate technology in precision analog reference circuits. In this article, the floating-gate device is constructed as a double-level polysilicon device. Tunneling regions between the two polysilicon levels is formed as a 400 Å film of silicon dioxide. It is believed that the manufacturing process implemented into this structure is relatively costly, given the requirement that a separate tunneling oxide film be deposited. In addition, this approach uses a relatively thick tunneling oxide film, which results in a relatively small capacitance per unit area.

BRIEF SUMMARY OF THE INVENTION

Embodiments of this invention to provide a programmable floating-gate element for an analog circuit, and method of fabricating the same, that can be efficiently implemented in an existing analog manufacturing process flow.

Embodiments of this invention provide such an element and method in which the programmed capacitor has a high capacitance per unit area, and thus can be implemented efficiently in minimal chip area.

Embodiments of this invention provide such an element and method in which inclusion of the floating-gate element does not necessitate change in the construction or electrical parameters of other circuit elements.

Embodiments of this invention provide such an element and method that is compatible with high voltage circuit applications.

Other objects and advantages of embodiments of this invention will be apparent to those of ordinary skill in the art having reference to the following specification together with its drawings.

Embodiments of this invention may be implemented into an integrated circuit, at the polysilicon gate level. The integrated circuit may include polysilicon gate electrodes, and perhaps capacitor plates, that are clad with a metal silicide such as cobalt silicide. In such an integrated circuit, a floating gate electrode in that same polysilicon gate level is protected from direct react silicidation by a silicide-block silicon dioxide film. A portion of the floating gate electrode overlies an active region with a gate dielectric therebetween, and serves as the gate electrode for a transistor in an analog circuit, such as an amplifier. Another portion of that floating gate electrode serves as a plate of a storage capacitor, the other plate of which is formed of a metal or metal nitride plate, with the silicon block silicon dioxide and another dielectric film therebetween. At least one other portion of the floating gate electrode overlies active regions with the gate dielectric therebetween, to define one or more tunnel capacitors.

BRIEF DESCRIPTION OF THE SEVERAL VIEWS OF THE DRAWING

FIG. 3 is a plan view of the physical construction of the device of FIG. 1, according to an embodiment of the invention.

DETAILED DESCRIPTION OF THE INVENTION

The present invention will be described in connection with one or more of its embodiments, namely as implemented into an analog circuit that can be programmably adjusted after manufacture, because it is contemplated that this invention will be especially beneficial when used in such an application. However, it is also contemplated that this invention can provide important benefits in other circuit and structure applications. Accordingly, it is to be understood that the following description is provided by way of example only, and is not intended to limit the true scope of this invention as claimed.

Figure 1:
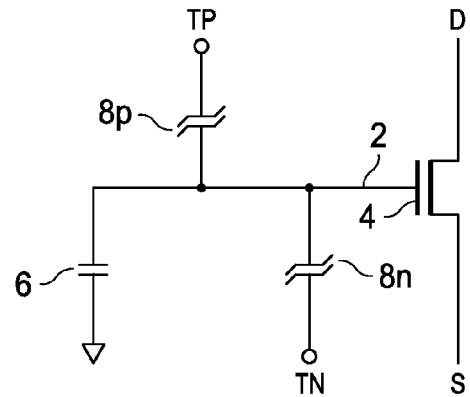
FIG. 1 is an electrical diagram, in schematic form, of a programmable floating gate device constructed according to embodiments of the invention.

FIG. 1 illustrates an electrical schematic incorporating analog floating-gate electrode 2 according to embodiments of this invention. In this example, analog floating-gate electrode 2 is a single electrode serving multiple functions. Electrode 2 serves as the gate electrode for metal-oxide-semiconductor (MOS) transistor 4, and as a first plate of storage capacitor 6. As will be described below, transistor 4 may be implemented into an input of an analog circuit or other function, such as an amplifier or the like. A second plate of storage capacitor 6 is coupled to a reference voltage, namely ground in this example. In operation, the voltage stored across storage capacitor 6 determines the voltage at the gate of MOS transistor 4, and thus the extent to which transistor 4 conducts between drain D and source S, for a given drain-to-source bias.

In embodiments of this invention, analog floating-gate electrode 2 can be programmed to a particular analog state by way of tunnel capacitors 8p, 8n. Analog floating-gate electrode 2 serves also as a first plate of each of these tunnel capacitors 8p, 8n. In this example, a second plate of tunnel capacitor 8p is connected to a terminal TP, while a second plate of tunnel capacitor 8n is connected to a terminal TN. The capacitor dielectric for tunnel capacitors 8p, 8n is contemplated to be relatively thin, to allow mechanisms such as Fowler-Nordheim tunneling to transfer charge between terminals TP, TN and analog floating-gate electrode 2, depending on the bias.

In operation, the programming of analog floating-gate electrode 2 by electrons tunneling through tunnel capacitor 8n is performed by applying a pulse of an appropriate negative voltage to terminal TN, relative to the voltage at terminal TP and to the ground reference voltage at the opposite plate of storage capacitor 6. An example of such a "programming" pulse, for a fully programmed level, is a voltage of about −11 volts at terminal TN relative to terminal TP and ground, for on the order of 20 msec. The voltage divider of capacitors 8n, 8p, 6 will result in most of that voltage appearing across tunnel capacitor 8n, enabling electrons to tunnel through its capacitor dielectric to analog floating-gate electrode 2. Those electrons will remain trapped at analog floating-gate electrode 2, considering that there is no direct (i.e., DC) connection between analog floating-gate electrode 2 and any other circuit element. Conversely, electrons can be removed from analog floating-gate electrode 2 by tunneling through tunnel capacitor 8p to terminal TP, upon application of an appropriate positive voltage at terminal TP relative to terminal TN and to the ground reference voltage at the opposite plate of storage capacitor 6. The voltage divider of capacitors 8n, 8p, 6 will result in most of that voltage appearing across tunnel capacitor 8p, enabling electrons to tunnel through its capacitor dielectric from analog floating-gate electrode 2. An example of such a "erase" pulse, to remove a fully programmed level, is a voltage of about +11 volts at terminal TP relative to terminal TN and ground, for on the order of 20 msec. The duration of the program and erase pulses can be adjusted to precisely set the charge state at analog floating-gate electrode 2. The charge trapped at analog floating-gate electrode 2 will thus define the voltage across storage capacitor 6, and thus the voltage at the gate of MOS transistor 4. Tunnel capacitors 8n, 8p thus enable precise setting of the charge at analog floating-gate electrode 2, and thus precise adjustment of the analog state of the circuit including MOS transistor 4.

Figure 2:
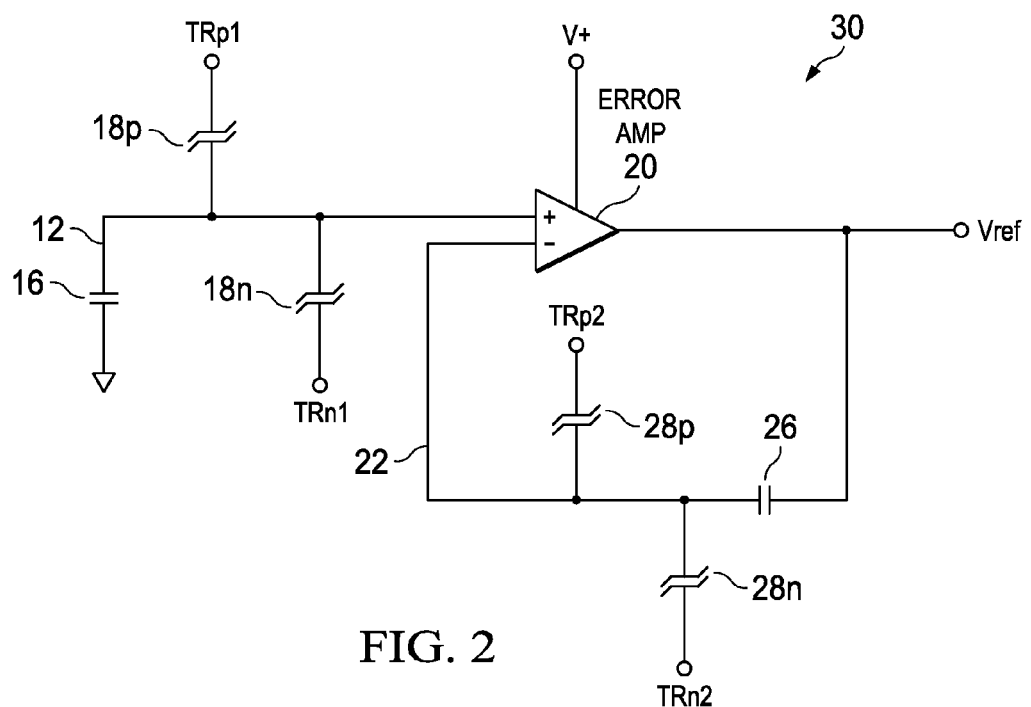
FIG. 2 is an electrical diagram, in schematic form, of an analog circuit application of the device of FIG. 1 according to an embodiment of the invention.

FIG. 2 illustrates an example of a circuit implementation according to embodiments of this invention, by way of reference voltage circuit 30. Reference voltage circuit 30 generates a reference voltage at the output node Vref of error amplifier 20, which is a conventional two-input operational amplifier (op amp), biased from power supply voltage V+. Error amplifier 20 has a positive (non-inverting) input that receives a voltage from the top plate of storage capacitor 16, the other plate of which is at ground, and a negative (inverting) input that is connected to one plate of feedback capacitor 26, the other plate of which is connected to the output of error amplifier 20 at node Vref. In this example, analog floating gate structure 12 serves as the top plate of capacitor 16, and is applied to the non-inverting input of error amplifier 20 by serving as the gate electrode for a MOS transistor (not shown) at that input. Similarly, analog floating-gate electrode 22 serves as a plate of feedback capacitor 26 and is also applied to the inverting input of error amplifier 20 by serving as the gate electrode for a MOS transistor (not shown) at that input.

Each of analog floating gate structures 12, 22 in reference voltage circuit 30 of FIG. 2 can be programmed with a desired level of charge, by way of Fowler-Nordheim tunneling. The programming of analog floating gate structure 12 is accomplished via tunnel capacitors 18p, 18n from terminals TRp1, TRn1, respectively, and the programming of analog floating-gate electrode 22 is accomplished via tunnel capacitors 28p, 28n from terminals TRp2, TRn2, respectively. As such, analog floating gate structures 12, 22 in reference voltage circuit 30 are constructed and function according to the generalized form of analog floating-gate electrode 2 of FIG. 1.

In operation, the voltage appearing at the non-inverting input of error amplifier 20 is defined by the amount of charge trapped at analog floating gate electrode 12 as a result of programming via tunnel capacitors 18p, 18n. Similarly, the feedback voltage applied to the inverting input of error amplifier 20 is adjusted by the amount of charge trapped at analog floating-gate electrode 22 as a result of programming via tunnel capacitors 28p, 28n. As a result, the reference voltage level at output node Vref of error amplifier 20, and the gain of error amplifier 20 (i.e., the feedback loop) can be precisely adjusted in reference voltage circuit 30, by the programming of the charge trapped at analog floating-gate electrodes 12, 22.

The amplifier analog circuit of FIG. 2 is provided by way of example only. It is contemplated that the analog floating gate structure of embodiments of this invention can also be implemented, with great advantage, in other circuit environments, including programmable gate array structures, trim capability for analog circuits and reference circuits in digital circuits, level shift circuits, multi-bit EEPROM memory cells (i.e., in which each floating gate memory cell is capable of storing intermediate levels), and the like. Those skilled in the art having reference to this specification will readily comprehend these, and other, alternative uses of embodiments of this invention.

FIG. 3 illustrates, in plan view, the construction of a circuit such as that shown in connection with FIG. 1, according to an embodiment of this invention. Corresponding FIGS. 4a through 4e illustrate, in cross-section, the construction of the various structures shown in FIG. 3. Of course, in those circuits in which multiple analog floating-gate electrodes are to be implemented, such as reference circuit 30 of FIG. 2, each of those analog floating-gate electrodes (e.g., electrodes 12, 22 in FIG. 2) will be similarly constructed as one another. It is contemplated that the sizes of elements shown in FIGS. 3 and 4a through 4e are not necessarily to scale, relative to one another. For example, the element widths shown in FIG. 3 may be substantially thinner, in actuality, relative to the length of the same element, depending on the manufacturing technology utilized. Similarly, the relative thicknesses of elements in the cross-sectional views of FIGS. 4a through 4e may not correspond to that encountered in actual devices. In any case, it is contemplated that this embodiment of the invention may be implemented using relatively aggressive manufacturing technology, extending into the sub-micron regime. It is therefore contemplated that those skilled in the art having reference to this specification will be readily able to adapt the structures of FIG. 3 and FIGS. 4a through 4e in the desired manufacturing technology, without undue experimentation.

Figure 4A:
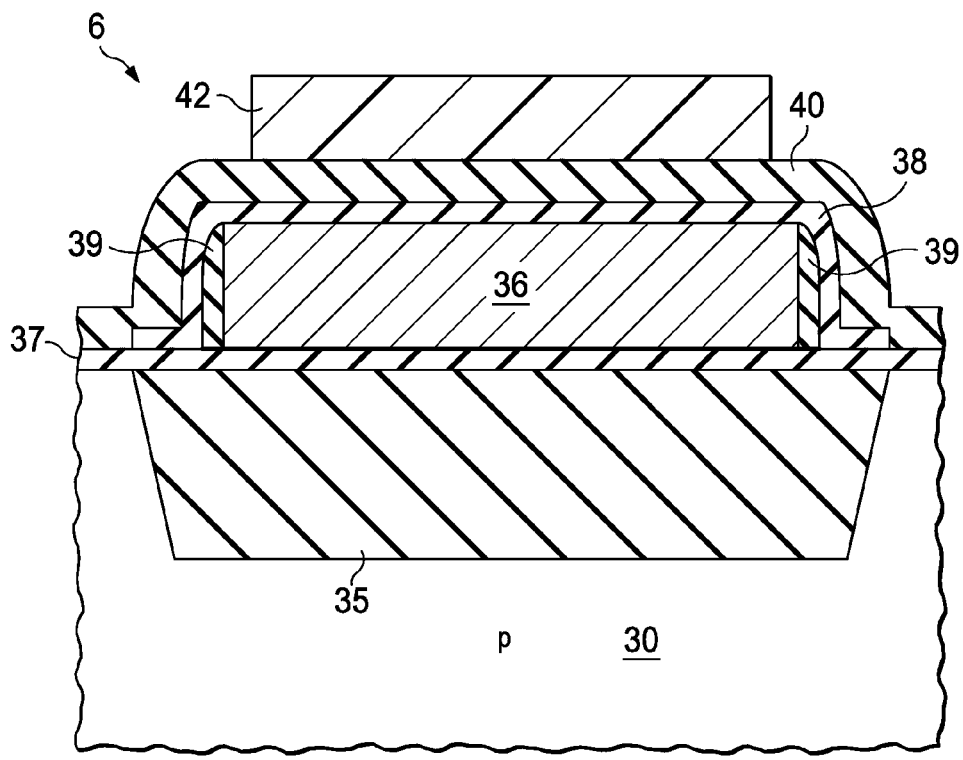
FIGS. 4a through 4e are cross-sectional views of the device of FIG. 3, according to that embodiment of the invention.

As shown in FIG. 3, analog floating-gate electrode 2 is constructed of polycrystalline silicon (polysilicon) element 36, which extends over the surface of a semiconductor wafer (or, in the silicon-on-insulator context, a support wafer having a semiconductor layer at a surface), to reach multiple devices or components. Polysilicon element 36 is typically doped to a desired conductivity type and concentration, to be conductive to the desired extent. For purposes of n-channel MOS transistor 4, and tunnel capacitors 8p, 8n, n-type doping of polysilicon element 36 is preferred. Polysilicon element 36 has a widened portion at one end, serving as a lower plate of storage capacitor 6. Referring to FIG. 4a, the lower plate portion of polysilicon element 36 overlies isolation dielectric structure 35, which is typically formed of silicon dioxide, deposited into a shallow trench previously etched into the semiconductor surface. Gate dielectric 37, for example formed of deposited silicon dioxide, is disposed between the surface of isolation dielectric structure 35 and polysilicon element 36. In this example, the surface into which isolation dielectric structure 35 is formed is the top surface of p-type silicon substrate 30. The upper plate of storage capacitor 6 is formed of tantalum nitride (TaN) plate 42, which overlies the widened portion of polysilicon element 36 at this location. In this embodiment of the invention, the capacitor dielectric is formed of silicon dioxide layer 38 disposed at the top surface of polysilicon element 36, with silicon nitride layer 40 disposed over silicon dioxide layer 38. Sidewall nitride (i.e., silicon nitride) elements 39 are disposed along the sidewalls of polysilicon element 36, underlying silicon dioxide layer 38.

According to embodiments of this invention, silicon dioxide layer 38 serves as a "silicide-block" dielectric. As known in the art, many integrated circuits are constructed to include a metal silicide cladding at certain silicon structures, such as transistor gate electrodes and polysilicon interconnects, to improve the conductivity of those structures. Conventionally, this metal silicide cladding is performed by direct reaction of a metal (e.g., cobalt, titanium, tungsten) deposited over the silicon structures to be silicide-clad, followed by a high temperature anneal to react the deposited metal with the underlying silicon. An etch is then performed to remove the unreacted metal from those locations at which the metal was not in contact with underlying silicon (e.g., over isolation dielectric structures 35 or gate dielectric 37). As known in the art, a "silicide-block" dielectric film (e.g., silicon dioxide layer 38) can be previously deposited overall, and subjected to a patterned etch so that specific silicon locations, such as the portion of polysilicon element 36 forming analog floating-gate electrode 2 (FIG. 3) will not become silicide-clad.

Figure 4B:
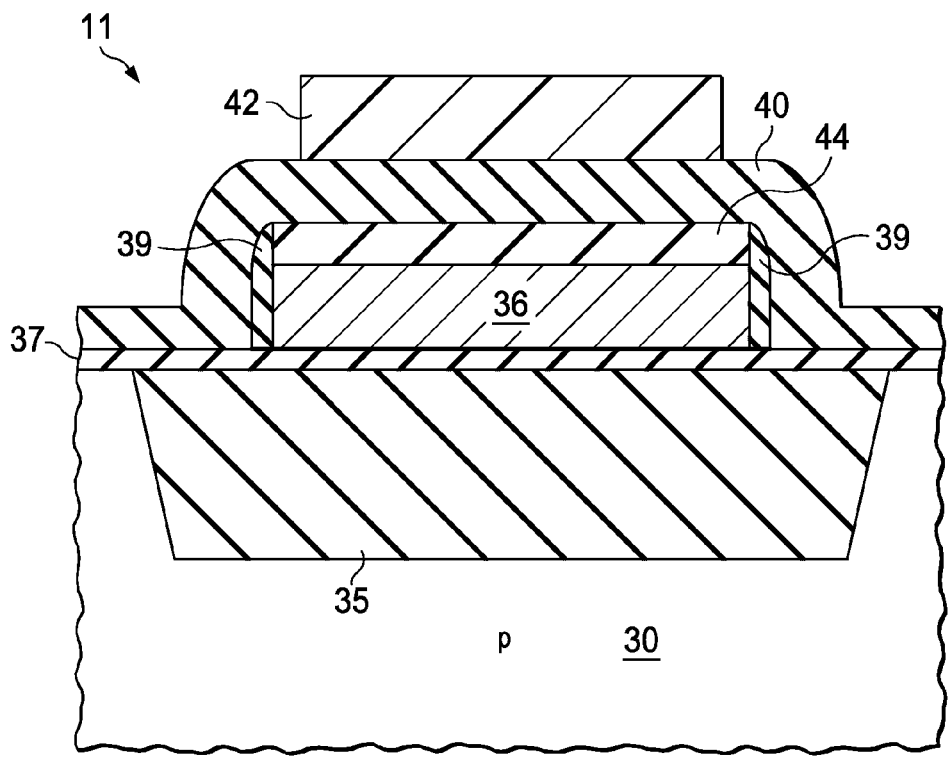

For example, referring to FIGS. 3 and 4b in combination, capacitor 11 is shown as an element in the same integrated circuit as analog floating-gate electrode 2, but is not electrically connected to analog floating-gate electrode 2. Capacitor 11 may serve, for example, as a capacitor within the same electrical circuit incorporating analog floating-gate electrode 2 or in another circuit. A lower plate of capacitor 11 is formed of another instance of polysilicon element 36, overlying isolation dielectric structure 35 and gate dielectric 37 (FIG. 4b). In this instance of capacitor 11, however, silicon-block silicon dioxide 38 is not present (i.e., has been removed from) over polysilicon element 36. As such, metal silicide 44 has been formed over polysilicon element 36, consuming some of polysilicon element 36 in forming this cladding. Sidewall nitride elements 39 preclude the formation of metal silicide 44 on the sidewalls of polysilicon element 36. Silicon nitride layer 40 is disposed over metal silicide 44, over which metal nitride plate 42 is deposited and patterned as shown.

It has been discovered, in connection with this invention, that the formation of metal silicide 44 over polysilicon element 36 is not conducive to long-term retention of charge, for example by analog floating-gate electrode 2. In this regard, it has been discovered that some residue of unreacted metal (or, in some cases, metal nitride or other reactive products between the deposited metal and the gas constituents of the environment in which the direct reaction takes place) often remains at locations adjacent to metal silicide 44 structures at transistor gates, capacitor plates, etc. This residue can be at least partially conductive in many instances, even if vanishingly thin or present merely as filaments. For elements involved in switching operation of the integrated circuit, such as transistor gates and interconnects, the conductivity of this residue is generally sufficiently poor that any deleterious effects are not measurable or noticeable, especially relative to the significant increase in conductivity of the silicide-clad gate level structures. However, for analog floating-gate functions such as described above, the setting of trim or reference levels at manufacture is intended to remain stable over long periods of time, hopefully for the useful life of the integrated circuit. As such, in connection with this invention, it has been discovered that charge trapped at a silicide-clad polysilicon capacitor plate and gate structure, serving as an analog floating-gate structure, is vulnerable to long-term leakage. The loss of this charge will, of course, alter the operation of circuits relying on the programmed adjustment or setting of charge at such a structure.

According to this embodiment of the invention, therefore, analog floating-gate electrode 2 of FIG. 3 is constructed to include silicide-block silicon dioxide layer 38, as shown in FIG. 4a. Use of this silicide-block silicon dioxide layer 38 allows the implementation of silicide cladding on other silicon structures in the same integrated circuit (such as the lower plate of capacitor 11 of FIGS. 3 and 4b), while still enabling long-term charge retention at analog floating-gate structures 2 in the same integrated circuit. Other complicating process steps, such as deposition and patterning of additional levels of polysilicon, are also avoided according to embodiments of this invention.

Figure 4C:
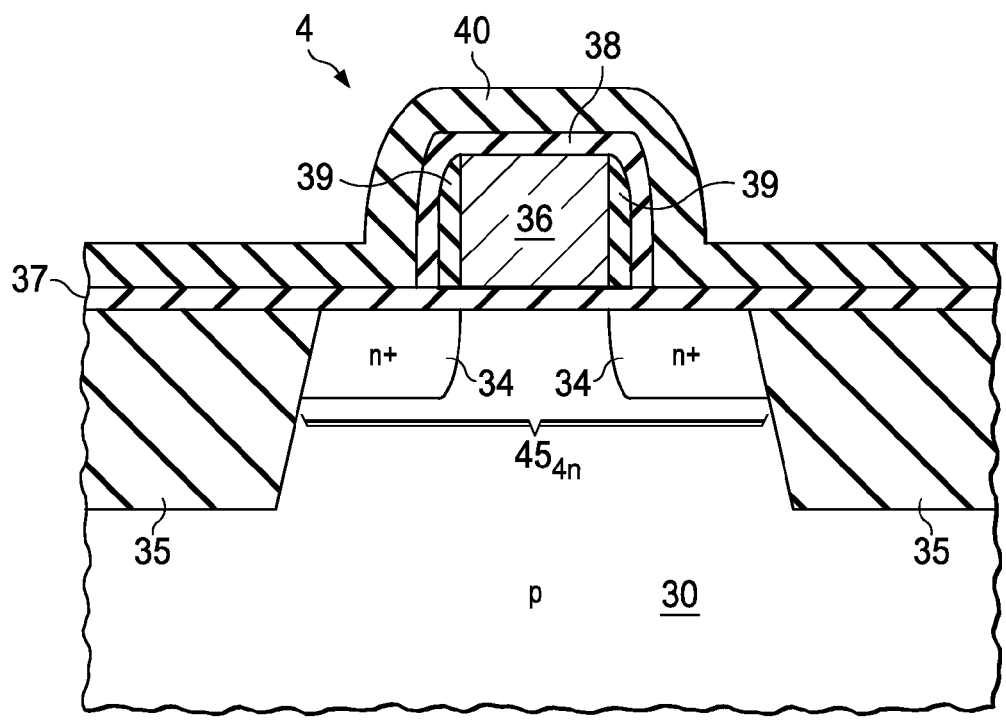

According to this embodiment of the invention, analog floating-gate electrode 2 also serves functions in other devices, including transistor 4 and tunnel capacitors 8p, 8n. As shown in FIG. 3, the instance of polysilicon element 36 defining analog floating-gate electrode 2 has an elongated portion extending from storage capacitor 6, and overlying active region $45_{4n}$. Active region $45_{4n}$, and also active regions $45_{8p}$, $45_{8n}$ shown in FIG. 3, are defined in the conventional manner as regions of the semiconductor surface at which isolation dielectric structures 35 are not located. At its location over active region $45_{4n}$, as shown in FIG. 4c, polysilicon electrode 36 defines a gate electrode of an n-channel transistor, with gate dielectric 37 disposed between polysilicon electrode 36 and the surface of active region $45_{4n}$, as shown. Silicon nitride layer 40 is disposed overall, as shown in FIG. 4c.

In this example, active region $45_{4n}$ is disposed between isolation dielectric structures 35, and is formed at a surface of p-type substrate 30; alternatively, this active region $45_{4n}$ may be formed at the surface of a p-type well that is formed into the substrate, as known in the art. According to this embodiment of the invention, in which transistor 4 is an n-channel MOS transistor, heavily-doped n-type source/drain regions 34 are formed on opposite sides of polysilicon element 36, in the conventional self-aligned fashion. Sidewall nitride elements 39, on the sidewalls of polysilicon element 36, space the heavily doped source/drain implant from the edges of the gate; in the conventional manner, lightly-doped source/drain extensions may be present under sidewall nitride elements 39, having been implanted before the formation of that film. The particular source/drain junction gradients can be engineered to the desired profile, as well known in the art.

Figure 4D:
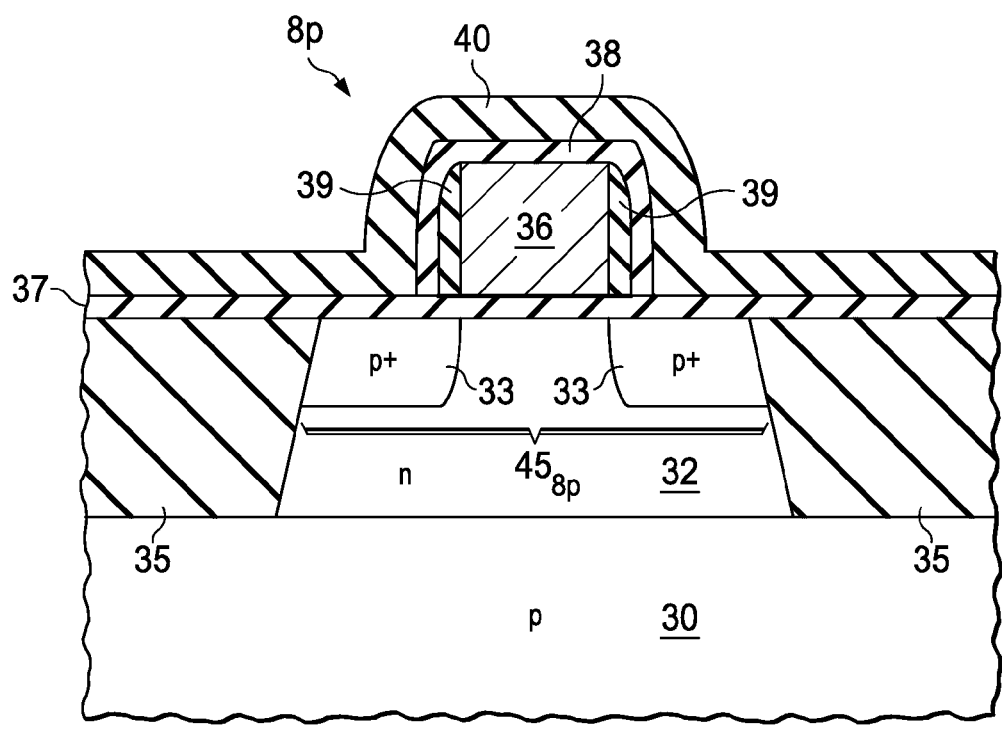

Referring back to FIG. 3, analog floating-gate electrode 2, formed in an instance of polysilicon element 36, extends further and overlies active region $45_{8p}$, at which tunnel capacitor 8p is formed according to this embodiment of the invention. FIG. 4d provides a cross-sectional view of tunnel capacitor 8p, as will now be described. Analog floating-gate electrode 2 throughout its length, as described above, is implemented as polysilicon element 36, protected from silicidation by silicide-block silicon dioxide layer 38 as shown also in FIG. 4d. At tunnel capacitor 8p, polysilicon element 36 is separated from the surface of active region $45_{8p}$ by gate dielectric layer 37, which serves as the capacitor dielectric of tunnel capacitor 8p. Silicon nitride layer 40 is disposed overall, as shown in FIG. 4d.

Tunnel capacitor 8p in this embodiment of the invention is formed at the surface of n-well 32, disposed at the surface of substrate 30 between isolation dielectric structures 35 as shown in FIG. 4d. N-well 32 is a relatively lightly-doped n-type region, formed at selected locations of the surface of substrate 30 in the manner known in the art. Heavily-doped p-type regions 33 are formed on opposite sides of polysilicon element 36 in this active region $45_{8p}$, in the conventional self-aligned manner for source and drain regions (of p-channel MOS transistors, in this case). As described above in connection with transistor 4, silicide-block silicon dioxide layer 38 and sidewall nitride elements 39 reside on the sidewalls of polysilicon element 36, and space these ion implant used to form p+ regions 33 in the desired manner; some lateral diffusion of this p-type dopant under the edges of polysilicon element 36 occurs, as shown in FIG. 4d. Lightly-doped source/drain extensions may also be formed to extend beneath sidewall nitride elements 39, as mentioned above and as known in the art, if a graded junction profile is desired.

While not shown in FIGS. 3 and 4d, top-side contacts to overlying metal conductors are provided in connection with tunneling capacitor 8p. Typically, p+ regions 33 and n-well 32 are shorted together by such top-side contacts, to implement tunnel capacitor 8p (rather than a p-channel MOS transistor). As described above in connection with FIG. 1, the voltage at n-well 32 and p+ regions 33 will be driven to a positive voltage during erase operations (i.e., removal of electrons from analog floating-gate electrode 2); in that event, the p-n junction between n-well 32 and substrate 30 will be reverse-biased, as desired. Gate dielectric 37 is contemplated to be sufficiently thin that tunneling electrons can tunnel therethrough under that bias.

Figure 4E:
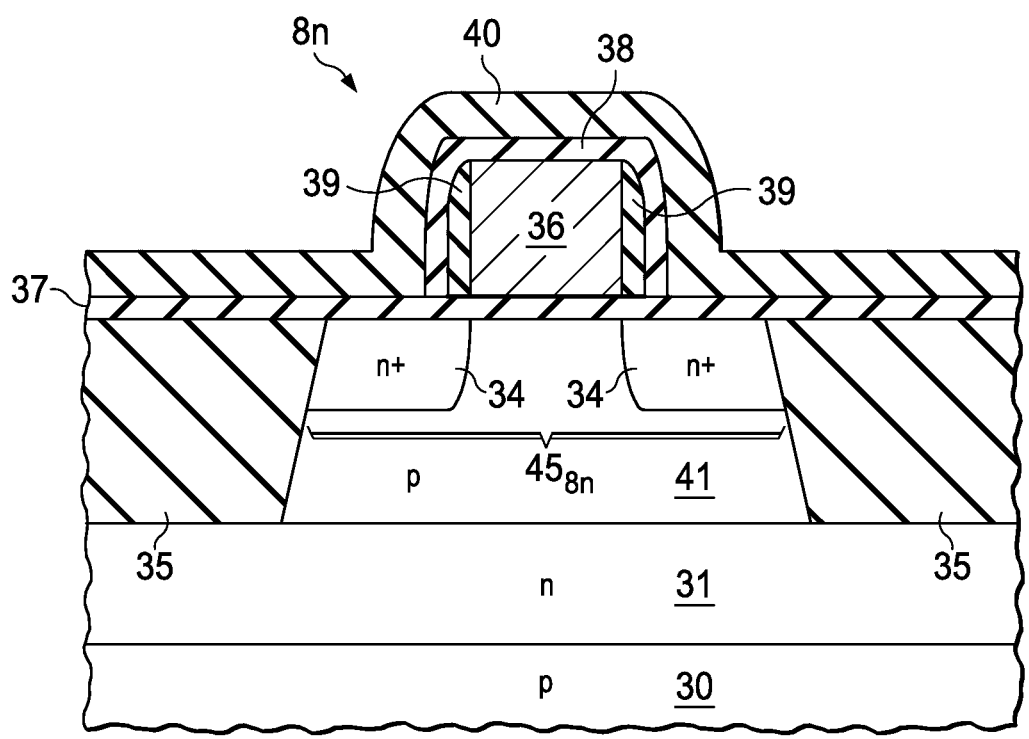

Analog floating-gate electrode 2 also extends over active region $45_{8n}$, to form tunneling capacitor 8n, as shown in FIGS. 3 and 4e. The construction of tunneling capacitor 8n is shown in FIG. 4e, by way of one example. In this location of the integrated circuit, polysilicon element 36 is also protected from silicidation by silicide-block silicon dioxide layer 38, which is over the entirety of the structure. Gate dielectric 37 is disposed between polysilicon element 36 and the surface of active region $45_{8n}$ at this location of active region $45_{8n}$, serving as the capacitor dielectric of tunnel capacitor 8n. Active region $45_{8n}$ is, again, defined as the location between isolation dielectric structures 35, as shown in FIG. 4e. Silicon nitride layer 40 is disposed overall, as shown in FIG. 4e.

The underlying structure of tunnel capacitor 8n differs from that of transistor 4 and tunnel capacitor 8p, in this example. N-type buried layer 31 is disposed at this location, to a relatively deep extent underlying the surface of active region $45_{8n}$. Isolated p-well 41 is also present at active region $45_{8n}$, ending at a depth above that of n-type buried layer 31. P-well 41 is isolated in the sense that it is not electrically connected or physically in contact to other p-wells within the integrated circuit; in this example, p-well 41 is contained between isolation dielectric structures 35 as shown. P-well 41 is a relatively lightly-doped p-type region, as typical for well structures in the art. Heavily-doped n-type regions 34 are disposed on opposite sides of polysilicon element 36 in this active region $45_{8n}$, spaced apart from the gate edges by sidewall nitride elements 39, in the conventional self-aligned manner for source and drain regions such as that of re-channel MOS transistor 4 described above in connection with FIG. 4c.

Tunnel capacitor 8n may also include lightly-doped source/drain extensions, as described above in connection with transistor 4. N-type regions 34 are preferably formed simultaneously with source/drain regions 34 of transistor 4.

Top-side contacts to overlying metal conductors are similarly provided in connection with tunneling capacitor 8n, as discussed above in connection with tunneling capacitor 8p. In this case, as typical in the art, n+ regions 34 and isolated p-well 41 will be shorted together by these top-side contacts, to form tunnel capacitor 8n instead of an n-channel MOS transistor. As described above in connection with FIG. 1, the voltage at p-well 41 and n+ regions 34 will be driven to a negative voltage during programming, while n-type buried layer 31 will be held at ground or some other stable voltage. As such, the p-n junction between p-well 41 and n-type buried layer 31 will be reverse-biased. Under this programming bias, electrons can tunnel through the relatively thin gate dielectric 37, to become trapped at analog floating-gate electrode 2.

Many variations in the construction of this region of the integrated circuit relative to that described above are contemplated. For example, the various wells and buried layers within substrate 30 can be realized in other ways than that shown and described in this specification. It is contemplated that those skilled in the art having reference to this specification will be readily able to realize those bulk structures and doping profiles, in a manner consistent with the operative manufacturing process and the function of tunnel capacitors 8p, 8n, transistor 4, and storage capacitor 6 as appropriate for the particular circuit application.

Referring back to FIG. 3, a significant difference in relative area between tunneling capacitors 8p, 8n, on one hand, and storage capacitor 6, on the other hand, will be evident to those skilled in the art having reference to this specification. This difference in relative area will, of course, be reflected in the relative capacitances between these elements. Of course, differences in the capacitor dielectric materials, and thicknesses, will also be reflected in those capacitances. In any event, it is desirable that the capacitance of storage capacitor 6 is substantially larger than the capacitances of tunnel capacitors 8n, 8p (and also the parasitic gate-to-active capacitance of transistor 4), to facilitate tunneling of electrons at reasonable bias voltages (thus avoiding damage or breakdown). In one example of embodiments of this invention, storage capacitor 6 occupies an area of about 1525 $\mu m^2$ with a capacitor dielectric (silicon nitride layer 40) of about 400 Å, while tunneling capacitors 8p, 8n occupy an area of about 2.5 $\mu m^2$ with a capacitor dielectric (gate dielectric 37) of about 75 Å; transistor 4 occupies an area of about 40 $\mu m^2$ in this example. With that construction, it has been observed, in connection with this invention, that the distribution of coupling of analog floating-gate electrode 2 to active regions in the structure of FIG. 3 will be about 89% at storage capacitor 6, about 10% at transistor 4, and about 0.5% each at tunneling capacitors 8p, 8n. This vast disparity in coupling is contemplated to be provide excellent programming and erasure (i.e., tunneling) performance.

Figure 5:
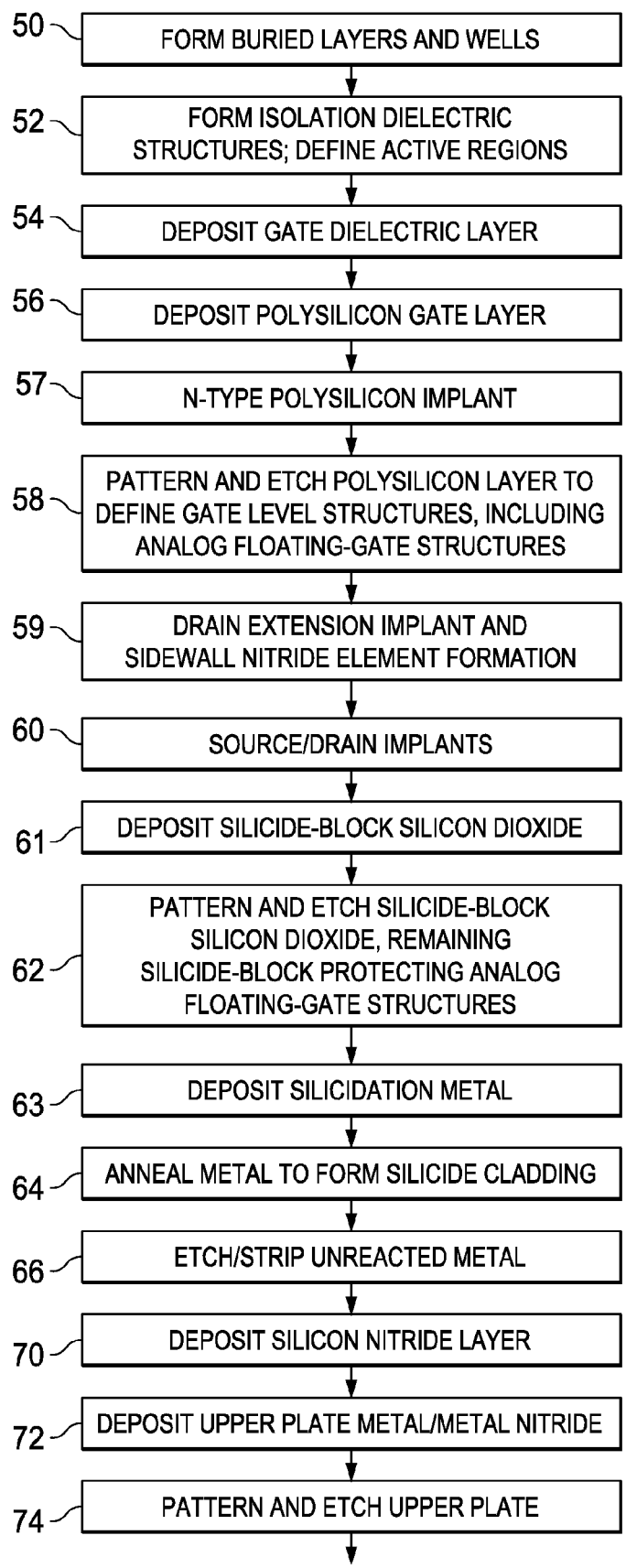
FIG. 5 is a flow diagram illustrating an example of the manufacturing process for fabricating the device of FIGS. 3 and 4a through 4c, according to an embodiment of the invention.

In addition, as described above, the use of silicide-block silicon dioxide layer 38 overlying polysilicon element 36 in forming analog floating-gate electrode 2 enables outstanding long-term retention of electrons at that structure, without risking charge leakage via silicidation residue and the like. This invention provides that outstanding performance, without unduly complicating the manufacturing process flow involved in construction of the integrated circuit, as will now be described in connection with FIG. 5.

Manufacturing of the integrated circuit including analog floating-gate electrode 2 according to embodiments of this invention begins with process 50, in which various doped regions are defined and formed into the semiconducting surface of substrate 30. These doped regions include regions such as n-type buried layer 31, n-type well 32, p-type well 41, as shown in FIGS. 4d and 4e, and the like, depending on the desired eventual structures. In process 52, isolation dielectric structures 35 are formed at selected locations of the surface. These isolation dielectric structures 35 may be formed in various conventional ways, including shallow trench isolation, deep trench isolation, local oxidation of silicon (LOCOS), and the like. As known in the art, the formation of isolation dielectric structures 35 serve to define the location of active regions of the semiconducting surface, at which transistors and some capacitors (including tunnel capacitors 8p, 8n in embodiments of the invention described above) are formed. While process 50 is shown as preceding process 52 in this example, in some manufacturing flows, the order of these steps may be reversed; further in the alternative, some wells and buried layers may be formed prior to isolation dielectric structures 35, with others formed after the formation of those isolation dielectric structures.

Following the definition of active regions at the surfaces of the desired well or wells (processes 50, 52), gate dielectric layer 37 is then formed in process 54. Gate dielectric 37 may be a deposited insulator, such as silicon dioxide, especially in modern sub-micron manufacturing processes with constrained thermal budgets. Alternatively, gate dielectric layer 37 may be formed by thermal oxidation of silicon, in the conventional manner. Following the formation of gate dielectric layer 37 in process 54 (and any desired threshold adjust ion implantation etc.), a polycrystalline silicon layer from which polysilicon elements 36 are to be formed is then deposited overall, in process 56.

In process 57, the polysilicon layer deposited in process 56 is doped n-type, by way of an ion implant of the appropriate species. Typically, this n-type implant is used to dope such structures as polysilicon resistors formed in this level. In this example, in which MOS transistor 4 is n-channel, the entirety of the polysilicon layer including polysilicon element 36 receives the implant of process 57. If p-channel MOS transistors are to be formed with gate electrodes in this polysilicon level (such transistors preferably including p-type polysilicon gate electrodes), then the implant of process 57 will be a patterned implant. Alternatively, doping process 57 may be performed in situ with the deposition of polysilicon layer in process 56. In process 58, polysilicon elements 36 are photolithographically patterned and etched, defining the various structures in the eventual integrated circuit that are to be formed in this layer, including analog floating-gate electrode 2, and other structures such as the silicide-clad lower plate of capacitor 11 (FIGS. 3 and 4b), transistor gates, and the like. While doping process 57 is shown in this process flow as occurring prior to etch process 58, polysilicon elements 36 may instead be doped after the patterned etch of process 58. As will be described below, doping of polysilicon elements 36 may also be performed later in the process, for example by way of the same implants used to form transistor source and drain regions.

In this example, in which graded source/drain junctions are implemented as typical in modern CMOS manufacturing, a drain extension implant (also referred to as "lightly-doped-drain", or LDD, implant) is performed in a self-aligned manner relative to the remaining polysilicon features overlying active areas, in process 59. If desired, the LDD implant may be performed for both n-channel and p-channel transistors, by way of masked implants. Following the drain extension implant, a silicon nitride layer is then deposited overall and etched anisotropically, also in this process 59, to form sidewall nitride elements 39 (FIGS. 4b through 4e) on the sidewalls of polysilicon structures including polysilicon elements 36. Once sidewall nitride elements 39 are formed in this manner, masked source/drain implants of both n-type and p-type are then performed, in process 60, self-aligned to the gate level structures within the respective active regions 45, in the usual manner. Process 60 may also include the appropriate anneal or other high-temperature drive-in process to place the implanted dopant at the desired depth.

According to embodiments of this invention, as described above, analog floating-gate electrode 2 is protected from direct react silicidation, while other structures (the lower plate of capacitor 11, transistor gates, polysilicon interconnects, etc.) are to be silicide-clad. As such, following the patterned etch of polysilicon elements 36 in process 58, silicide-block silicon dioxide 38 is deposited overall in process 61. Materials other than silicon dioxide may alternatively be used for this silicide block material; however, because this layer eventually becomes part of the capacitor dielectric for storage capacitor 6 in embodiments of this invention, this silicide block layer should of course be electrically insulating. In addition, according to embodiments of this invention, analog floating-gate electrode 2 is intended to retain trapped charge for long periods of time; as such, it is useful for the silicide-block layer deposited in process 61 to be a high quality dielectric, from a leakage standpoint. Silicon dioxide is contemplated to be a suitable film for this purpose, as described above.

In process 62, silicide-block silicon dioxide layer 38 deposited in process 60 (or such other silicide block material, as discussed above) is photolithographically patterned and etched. According to embodiments of this invention, as described above, silicide-block silicon dioxide layer 38 is removed from those locations and instances of polysilicon element 36 that are to be silicide-clad, while retained at analog floating-gate electrode 2 and other elements that are not to be silicide-clad. It is contemplated that, in most implementations, most if not all polysilicon gate-level structures other than structures serving the function of analog floating-gate electrodes 2 will be silicide-clad, and as such will have silicide-block silicon dioxide layer 38 removed therefrom in process 62.

Following etch process 62, the silicidation metal is then deposited overall in process 63. In the embodiments of this invention described above, the metal deposited in process 63 is cobalt; other silicidation metals such as titanium, tungsten, and the like may alternatively be used. In process 64, a high temperature anneal is performed to react this deposited metal at those locations at which the metal is in contact with underlying silicon (e.g., at the lower plate of capacitor 11) to form cladding 44 of a metal silicide compound, as shown in FIG. 4b. Conversely, those silicon structures that are not in contact with the silicidation metal, such as analog floating-gate electrode 2 at which silicide-block silicon dioxide layer 38 remains after process 62, will not react with the deposited metal. Following the silicidation anneal of process 64, a conventional etch or strip is performed to remove the unreacted metal and byproducts from the surface, leaving silicide cladding 44 behind wherever formed.

Storage capacitor 6 and capacitor 11, among other elements, are completed with the deposition of silicon nitride layer 40 in process 70. As described above, silicon nitride layer 40 serves as the capacitor dielectric for capacitor 11, and as part of the capacitor electric for storage capacitor 6, and is contemplated to be a relatively high quality dielectric, providing high capacitance per unit area; silicon nitride is thus a good choice for this material. Alternatively, other dielectric materials such as silicon dioxide can be used as this insulating film. In process 72, the upper plate metal or metal compound for storage capacitor 6 and capacitor 11 is deposited overall in process 72. According to one example of embodiments of this invention, the material deposited in process 72 is tantalum nitride (TaN). Alternatively, another conductive material comprised of a metal, including elemental metal and also metal compounds such as metal nitrides, may be deposited in process 72 and serve as the upper plate of these devices. In process 74, this metal or metal compound layer is photolithographically patterned and etched to define the upper plates of storage capacitor 6 and capacitor 11, as well as other elements including metal interconnects, capacitor plates, bond pads, and the like.

Following process 74, the integrated circuit including analog floating-gate electrode 2 constructed according to embodiments of this invention is then completed by way of the appropriate processing steps for its other structures and elements, including the formation of insulating layers, etching of contacts, formation of metal or other conductor layers making contact to the elements described above, including the top-side contacts to the doped active regions of tunnel capacitors 8p, 8n, and the like, in the conventional manner. It is contemplated that those skilled in the art having reference to this specification will be readily able to implement those additional process steps as appropriate for the particular manufacturing process technology and the desired construction of the integrated circuit.

Embodiments of this invention provide important advantages in the fabrication of integrated circuits, including analog integrated circuits and circuits including adjustable or trimmable elements, such as reference circuits. More particularly, embodiments of this invention provide an analog floating-gate electrode structure that can be programmed and erased to precisely set an adjustable level of trapped charge that can define a particular analog level for an electronic circuit. This structure is capable of retaining that trapped charge for long periods of time, and as such is suitable for use as an element that is trimmable or adjustable at manufacture. In addition, this structure can be constructed in a manner that is compatible with existing manufacturing process flows, without unduly complicating the process flows required.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit formed at a semiconductor surface of a body, including an electrically programmable capacitor structure for an analog semiconductor integrated circuit, the integrated circuit comprising:
a first polysilicon electrode;
silicide-block silicon dioxide disposed over the first polysilicon electrode, the silicide-block silicon dioxide being free of nitrogen;
a capacitor dielectric film disposed over the silicide-block silicon dioxide over the first polysilicon electrode, the capacitor dielectric film comprising nitrogen;

a first conductive plate, comprising a metal and disposed over a first portion of the first polysilicon electrode with the capacitor dielectric film and the silicide-block silicon dioxide therebetween;

a second polysilicon electrode, having at least a portion clad with a metal silicide, the second polysilicon electrode formed from the same polysilicon layer as the first polysilicon electrode; and a second conductive plate, comprising a metal and disposed over the clad portion of the second polysilicon electrode with the capacitor dielectric film therebetween.

2. The integrated circuit of claim 1, further comprising:
first and second active regions of the semiconductor surface;
source and drain doped regions formed within the first and second active regions; and
a gate dielectric film disposed over the first and second active regions;
wherein the first polysilicon electrode has a second portion extending over the first active region, with the gate dielectric film disposed therebetween, to form a first tunnel capacitor;
further wherein the first polysilicon electrode has a third portion extending over the second active region, with the gate dielectric film disposed therebetween, to serve as a transistor gate electrode the first polysilicon electrode.

3. The integrated circuit of claim 2, wherein the capacitor dielectric film is disposed over the clad portion of the polysilicon electrode; and further comprising:
a second conductive plate, comprising a metal and formed in the conductor level, the second conductive plate disposed over the clad portion of the second polysilicon electrode with the capacitor dielectric film therebetween.

4. The integrated circuit of claim 1, wherein the metal silicide is cobalt silicide.

5. The integrated circuit of claim 1, wherein the first conductive plate is comprised of a metal nitride.

6. The integrated circuit of claim 5, wherein the metal nitride is tantalum nitride.

7. The integrated circuit of claim 1, further comprising:
a third active region of the semiconductor surface;
and wherein the first polysilicon electrode has a fourth portion, extending over the third active region, with the gate dielectric film disposed therebetween, to form a second tunnel capacitor.

8. An analog circuit, formed at a semiconductor surface of a body, the circuit comprising:
first and second transistors, each having source and drain regions formed at an active region of the semiconductor surface, and having a gate electrode;
a storage capacitor, having a first plate coupled to the gate of the first transistor, and having a second plate coupled to a reference voltage;
a first tunnel capacitor, having a first plate connected to the first plate of the storage capacitor, and a second plate coupled to a first terminal;
a second tunnel capacitor, having a first plate connected to the first plate of the storage capacitor, and a second plate coupled to a second terminal;
wherein the first plate of the storage capacitor, the first plate of the first tunnel capacitor, the first plate of the second tunnel capacitor, and a gate electrode of the first transistor, are formed as portions of a first floating gate electrode comprised of polycrystalline silicon;

wherein the gate electrode of the second transistor is comprised of polycrystalline silicon from the same level as the first floating gate electrode, and is clad with a metal silicide;
wherein the first floating gate electrode is protected from the metal silicide by silicide-block silicon dioxide;
wherein the second plates of the first tunnel capacitor and second tunnel capacitors are formed by an active region at the surface;
and wherein the second plate of the storage capacitor is comprised of a metal overlying a portion of the first floating gate electrode, with a capacitor dielectric film and the silicide-block silicon dioxide therebetween.

9. The circuit of claim 8, wherein the metal silicide is cobalt silicide.

10. The circuit of claim 8, wherein the second plate of the storage capacitor is comprised of a metal nitride.

11. The circuit of claim 10, wherein the metal nitride is tantalum nitride.

12. An analog reference circuit constructed at a semiconductor surface of a body, comprising:
an amplifier, having first and second MOS transistor inputs and an output;
a reference capacitor, having a first plate coupled to the first input of the amplifier, and having a second plate coupled to a ground reference voltage;
a feedback capacitor, having a first plate coupled to the second input of the amplifier, and having a second plate coupled to the output of the amplifier;
a first tunnel capacitor, having a first plate connected to the first plate of the reference capacitor, and a second plate formed in a first active region of the semiconductor surface, and coupled to a first terminal;
a second tunnel capacitor, having a first plate connected to the first plate of the reference capacitor, and a second plate formed in a second active region of the semiconductor surface, and coupled to a second terminal;
wherein the first plate of the reference capacitor, the first plate of the first tunnel capacitor, the first plate of the second tunnel capacitor, and a gate of the first MOS transistor input of the amplifier, are formed as portions of a first floating gate electrode comprised of polycrystalline silicon having a silicide-block silicon dioxide film thereover;
and wherein the second plate of the reference capacitor is formed as a portion of a common conductor layer comprised of a metal overlying a portion of the first floating gate electrode, with a capacitor dielectric film and the silicide-block silicon dioxide therebetween.

13. The circuit of claim 12, further comprising:
a third tunnel capacitor, having a first plate connected to the first plate of the feedback capacitor, and a second plate formed in a third active region of the semiconductor surface, and coupled to a third terminal;
a fourth tunnel capacitor, having a first plate connected to the first plate of the feedback capacitor, and a second plate formed in a fourth active region of the semiconductor surface, and coupled to a fourth terminal;
wherein the first plate of the feedback capacitor, the first plate of the third tunnel capacitor, the first plate of the fourth tunnel capacitor, and a gate electrode of the second MOS transistor input of the amplifier, are formed as portions of a second floating gate electrode comprised of polycrystalline silicon having a silicide-block silicon dioxide film thereover;

and wherein the second plate of the feedback capacitor is formed from the common conductor layer and are overlying a capacitor dielectric film.

* * * * *